US005272980A

United States Patent [19]

Takeuchi et al.

[11] Patent Number: 5,272,980

[45] Date of Patent: Dec. 28, 1993

[54] ALIGNMENT METHOD FOR TRANSFER AND ALIGNMENT DEVICE

[75] Inventors: Satoshi Takeuchi; Kenji Asaka, both of Tokyo, Japan

[73] Assignee: Dai Nippon Printing Co. Ltd., Japan

[21] Appl. No.: 752,010

[22] Filed: Aug. 29, 1991

[30] Foreign Application Priority Data

Aug. 31, 1990 [JP] Japan .................................. 2-231563
Sep. 28, 1990 [JP] Japan .................................. 2-259304

[51] Int. Cl.$^5$ .................................................. B41F 9/00

[52] U.S. Cl. ............................ 101/481; 101/DIG. 36; 101/170; 101/485; 33/620

[58] Field of Search ............... 101/129, 170, 481, 485, 101/486, DIG. 36, 250; 33/614, 617, 620, 623

[56] References Cited

U.S. PATENT DOCUMENTS

| | | | |
|---|---|---|---|
| 3,696,738 | 10/1972 | Walker | 101/DIG. 36 |
| 3,915,090 | 10/1975 | Horst et al. | 101/DIG. 36 |
| 3,998,156 | 12/1976 | Zimmer | 101/248 |
| 4,604,966 | 8/1986 | Kohn | 101/120 |
| 4,610,200 | 9/1986 | Metso | 101/126 |
| 4,945,829 | 8/1990 | Ericsson | 101/129 |

FOREIGN PATENT DOCUMENTS

| | | | |
|---|---|---|---|
| 259446 | 12/1985 | Japan | 101/DIG. 36 |
| 49218 | 3/1986 | Japan | 101/486 |

*Primary Examiner*—Edgar S. Burr
*Assistant Examiner*—Stephen R. Funk
*Attorney, Agent, or Firm*—Ladas & Parry

[57] ABSTRACT

While a pattern side register mark provided on a pattern transferring plate provided with a transfer pattern and a work side register mark provided on a work are optically observed by means of an observation optical system, at least one of the pattern transferring plate and a work surface plate carrying thereon the work is moved in a non-contact state in accordance with information provided by the observation optical system to effect registration between the transfer pattern and the work, so that the pattern transferring plate is pressed to the work thereby to transfer the transfer pattern onto the work.

11 Claims, 12 Drawing Sheets

1
2
4
10
3
5
STAGE DRIVING UNIT
8
ALIGNMENT SHIFT QUANTITY CALCULATION UNIT
9
STAGE CONTROL UNIT

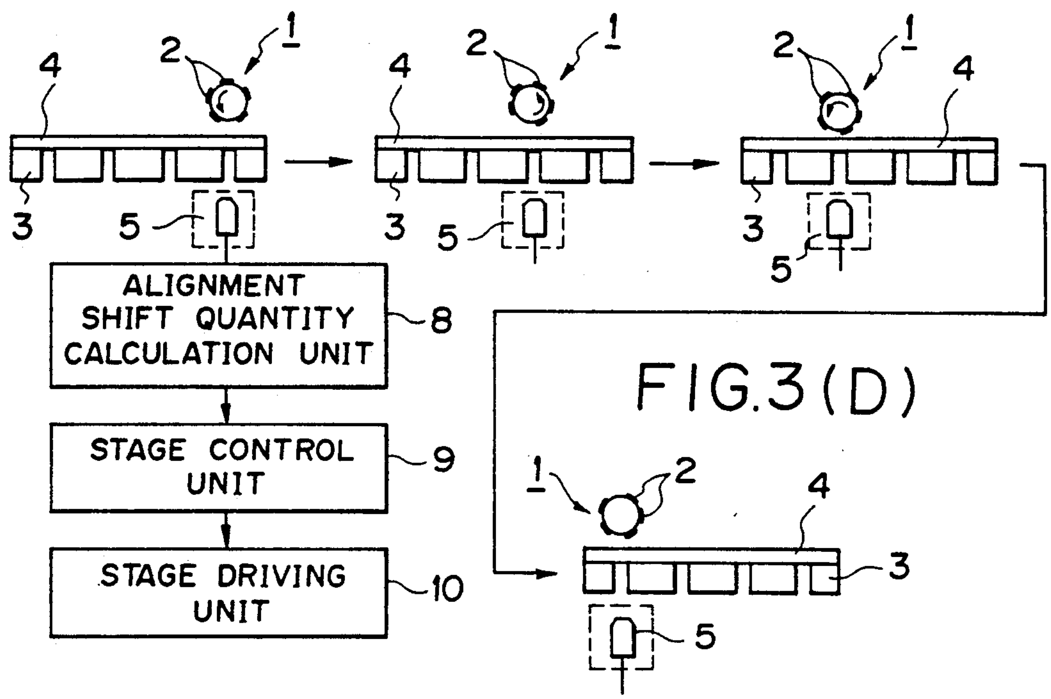
FIG.3(A)
FIG.3(B)
FIG.3(C)
FIG.3(D)
ALIGNMENT SHIFT QUANTITY CALCULATION UNIT
STAGE CONTROL UNIT
STAGE DRIVING UNIT
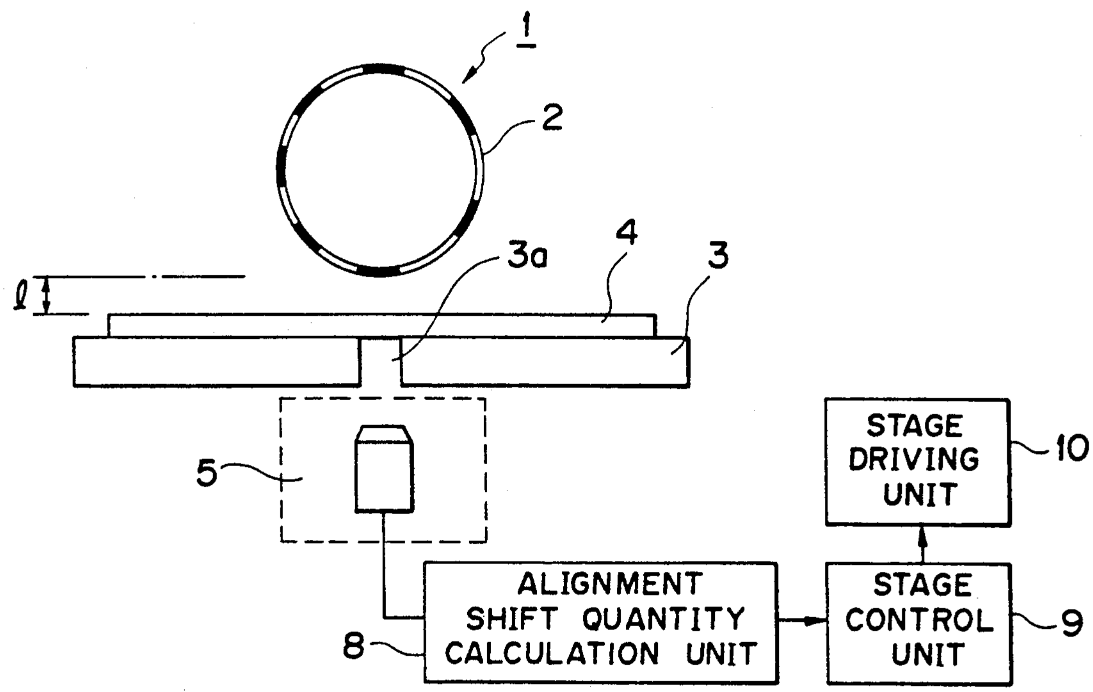
FIG.4
STAGE DRIVING UNIT
ALIGNMENT SHIFT QUANTITY CALCULATION UNIT
STAGE CONTROL UNIT 5
11
1
2
4
3
ALIGNMENT SHIFT QUANTITY CALCULATION UNIT
STAGE CONTROL UNIT
STAGE DRIVING UNIT
8
9
10

1
2
20
ROLLER DRIVING UNIT
4
3
9
5
8
ALIGNMENT SHIFT QUANTITY CALCULATION UNIT
STAGE CONTROL UNIT

ALIGNMENT METHOD FOR TRANSFER AND ALIGNMENT DEVICE

BACKGROUND OF THE INVENTION

The present invention relates to an alignment method and an alignment apparatus for transfer, and more specifically to an alignment method and an alignment apparatus for a transfer process which is capable of correctly repeating the transfer of a transfer pattern to a work with high precision, and may particularly preferably be used in a transfer process wherein a printing plate having a curved surface is used as in the case of a roller transfer process, etc., and a pattern thereof is sequentially transferred to the work while the contact face between the plate and the work is shifted. For example, the present invention is particularly preferably applicable to the production of a thin film semiconductor element.

For example, in the case of the production of a thin film semiconductor element, it is necessary to correctly prepare a minute pattern for forming a circuit or an element.

In the production of such a thin film semiconductor element, for example, it is conceivable to use a method wherein a resist ink is directly applied onto a work (or material to be subjected to processing); or a photoresist layer is formed thereof by coating in advance, the work is supplied with a printing ink layer which has a predetermined configuration and is capable of intercepting ultraviolet rays, by a printing process, the resultant work is subjected to exposure and development steps, and then is subjected to an etching treatment, thereby to provide a minute pattern for forming an electric circuit or element.

In such a process, in order to correctly form the minute pattern for forming a circuit or an element of a thin film semiconductor by use of a printing process, it is necessary to effect correct positioning between the printed pattern which has already been formed on the member to be printed, and a pattern of the printing ink to be newly subjected to printing.

However, in the conventional printing process, in general, the positioning (or registration) between a member to be printed and a printing ink pattern is regulated by using preliminary printing in advance. When good results are obtained in a certain step of the preliminary printing, the printing ink pattern is actually transferred to the member to be printed. In the prior art, even when the positional relation between the member to be printed and the printing ink pattern is changed to a certain extent, the transfer of the printing ink pattern is generally continued regardless of such a change.

Accordingly, the positioning precision and reproducibility in the positioning of the printing ink pattern to be transferred to the member to be printed by the conventional printing process is at most 20 to 30 μm, which does not reach the level of the positioning precision and reproducibility required for an electroconductive minute pattern for the thin film semiconductor element, etc.

SUMMARY OF THE INVENTION

A principal object of the present invention is, in view of the above problems encountered in the prior art, to provide an alignment method and an alignment apparatus for a transfer process, which is capable of correctly transferring a transfer pattern of a pattern transferring plate to a work with high positioning precision and reproducibility comparable therewith, and may preferably be used for, e.g., the production of a thin film semiconductor element.

According to a first aspect of the present invention, there is provided an alignment method for transfer process for pressing a transfer pattern formed on a pattern transfer plate to a work so as to transfer the transfer pattern to the work, the method comprising:

a step of moving at least one of a work surface plate and the pattern transfer plate in a non-contact state in accordance with information provided by an observation optical system, while optically observing a pattern side register mark provided on the pattern transfer plate on which the transfer pattern has been formed, and a work side register mark provided on the work disposed on the work surface plate disposed opposite to the pattern transfer plate, so that the pattern side register mark and the work side register mark are superposed on each other to effect registration between the transfer pattern and the work; and a step of pressing the pattern transfer plate to the work thereby to transfer the transfer pattern to the work.

According to the above first aspect of the present invention, the positioning between the transferring pattern and the work to which the pattern is to be transferred is effected with respect to each of the works while being optically observed, whereby the transferring pattern can correctly be transferred onto the work with high reproducibility.

According to a second aspect of the present invention, there is provided an alignment apparatus comprising:

an observation optical system for optically observing a pattern side register mark provided on the pattern transfer plate provided with the transfer pattern, and a work side register mark provided on the work disposed on a work surface plate disposed opposite to the pattern transfer plate;

an alignment quantity calculation unit for calculating a positional difference between the pattern side register mark and the work side register mark in accordance with information provided by the observation optical system;

a stage control unit for outputting a control signal in accordance with calculation result provided by the alignment quantity calculation unit; and a stage driving unit for moving the work surface plate to a position where the work side register mark and the pattern side register mark are superposed on each other, in accordance with the control signal output by the stage control unit.

According to a third aspect of the present invention, there is provided an alignment apparatus comprising;

an observation optical system for optically observing a pattern side register mark provided on the pattern transfer plate provided with the transfer pattern, and a work side register mark provided on the work disposed on a work surface plate disposed opposite to the pattern transfer plate;

an alignment quantity calculation unit for calculating a positional difference between the pattern side register mark and the work side register mark in accordance with information provided by the observation optical system;

a stage control unit for outputting a control signal in accordance with calculation result provided by the alignment quantity calculation unit; and a pattern transfer plate driving unit for moving the pattern transfer plate to a position where the work side register mark and the pattern side register mark are superposed on each other, in accordance with the control signal output by the stage control unit.

According to the above second and third aspects of the present invention, the transferring pattern can correctly be transferred onto the work with high reproducibility in an alignment for a transfer process where the positioning between the work and the transferring pattern is effected.

These and other objects, features and advantages of the present invention will become more apparent upon a consideration of the following description of the preferred embodiments of the present invention taken in conjunction with the accompanying drawings.

BRIEF DESCRIPTION OF THE DRAWINGS

FIGS. 3(A) to 3(D) are schematic views for illustrating an embodiment of the method for the registration between a work and a transferring pattern according to the present invention.

FIG. 4 is a schematic view for illustrating an embodiment of the structure of the alignment apparatus according to the present invention.

FIG. is a schematic view for illustrating an embodiment of the structure of the alignment apparatus according to the present invention.

Figure 12:
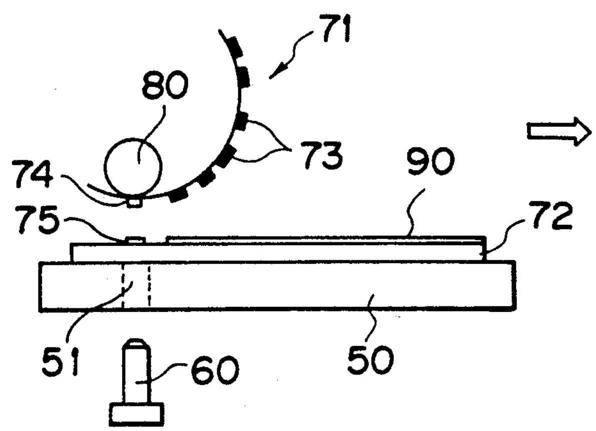
Figure 12:
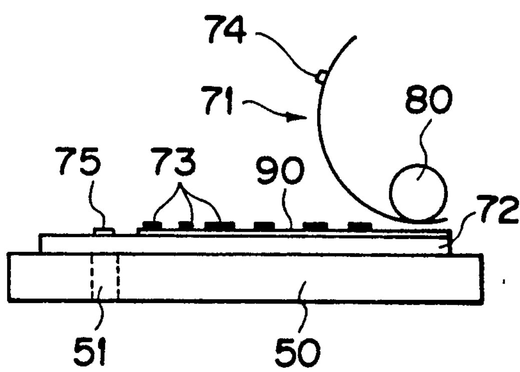

FIG. 12(A) and 12(B) are schematic views for illustrating the relation between the pattern transfer plate and the work used in another embodiment of the transfer alignment method according to the present invention.

FIGS. 13(A) to 13(C) are schematic sectional views each showing an embodiment of the structure of a flat pattern transferring plate.

Figure 14:
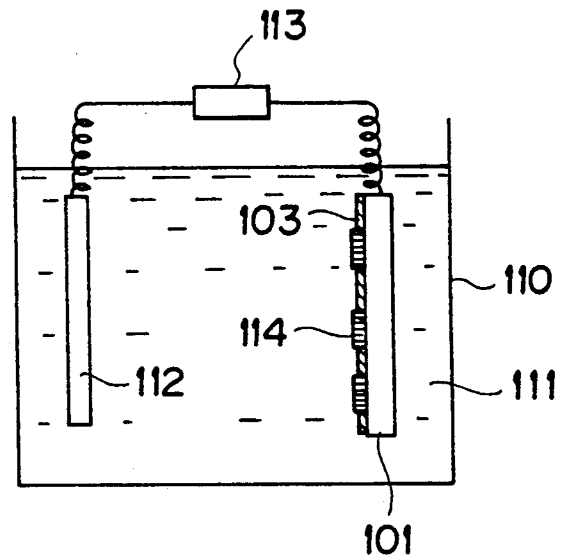

FIG. 14 is a schematic view for illustrating the deposition of an electrodeposition ink by electrolysis.

Figure 15:
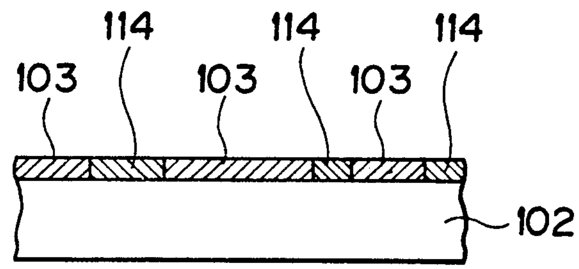

FIG. 15 is a schematic sectional view showing a state wherein the electrodeposition ink is deposited on the pattern transferring plate.

Figure 16:
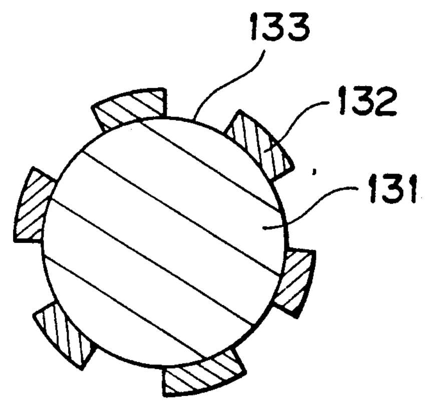
Figure 16:
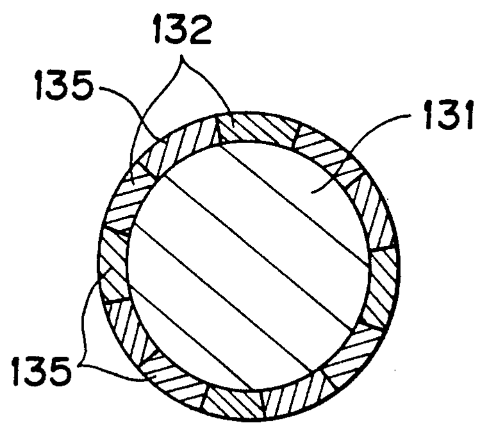

FIGS. 16(A) and 16(B) are schematic sectional views each showing an embodiment of the structure of the pattern transferring plate in a roller form.

FIGS. 17(A) to 17(E) are schematic views for illustrating steps for forming a transferring pattern on the pattern transferring plate in a flat form.

FIGS. 18(A) to 18(C) are schematic views for illustrating steps for forming a transferring pattern on the pattern transferring plate in a cylindrical form.

DESCRIPTION OF THE PREFERRED EMBODIMENTS

Hereinbelow, the present invention will specifically be described with reference to preferred embodiments thereof.

First, the pattern transferring plate to be used in the present invention may be a flat plate, a cylindrical plate or a curved surface comprising a portion thereof, or a substrate provided with a pattern wound around a cylindrical surface.

Hereinbelow, there will be described an embodiment wherein a roller having a cylindrical surface is used as the pattern transferring plate.

Figure 1:
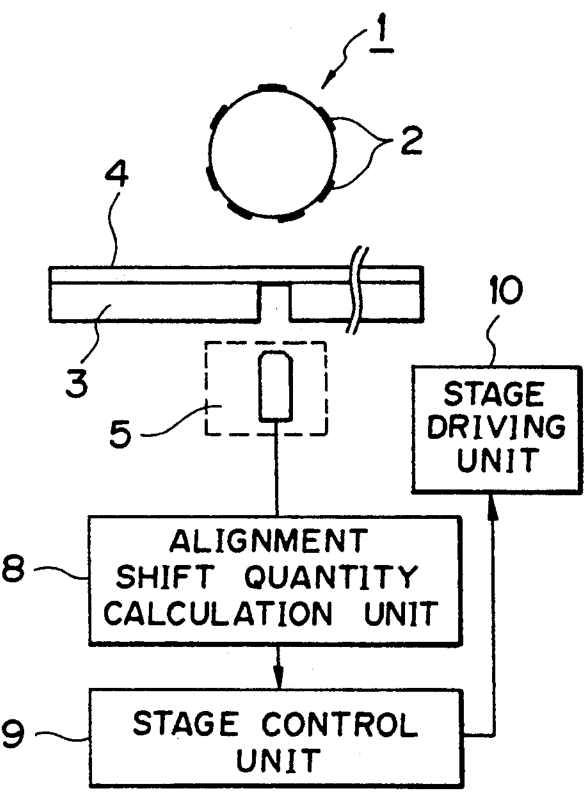
FIGS. 1(A) to 1(C) are schematic views for sequentially illustrating the relation between a work and a transferring pattern in each of sequential steps used in an embodiment of the transfer alignment method according to the present invention.
Figure 1:
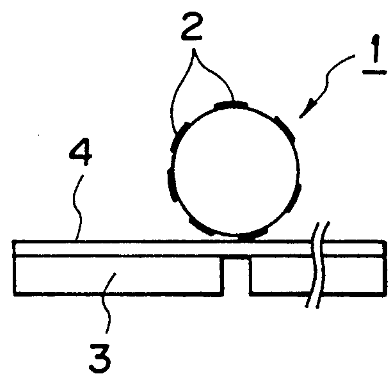
Figure 1:
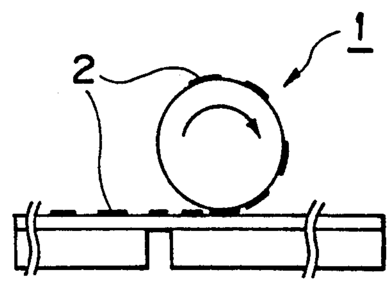

FIGS. 1(A) to 1(C) are schematic views for sequentially illustrating the relation between a roller 1 as a pattern transferring platc and a work 4 in each of sequential steps used in an embodiment of the transfer alignment method according to the present invention. In FIGS. 1(B) and 1(C), the illustration of an alignment apparatus shown in FIG. 1(A) is omitted.

As shown in FIG. 1(A), in the alignment method according to the present invention, first of all, while a pattern side register mark (not shown) disposed on (or in) a transferring pattern 2 formed on the roller 1, and a work side register mark (not shown) disposed on the work 4 which is disposed on a work surface plate 3 disposed opposite to the roller 1 are optically observed by means of an observation optical system 5, the work surface plate 3 or the roller 1 is moved in accordance with the information provided by the observation optical system 5 to superpose the above register marks on each other, thereby to effect the registration between the transferring pattern 2 and the work 4. Further, it is also possible to fix the work surface plate 3 and to move the roller 1 so as to effect the registration between the transferring pattern 2 and the work 4.

The registration described above may be effected as shown in FIGS. 2(A) and 2(B). In other words while the positional relation between the pattern side register mark 6 disposed in a predetermined position of the transferring pattern 2 and the work side register mark 7 disposed in a predetermined position of the work 4 is observed by means of the observation optical system 5, the work surface plate 3 or the roller 1 is moved to a position such that the pattern side register mark 6 and the work side register mark 7 are superposed on each other.

Figure 2A:
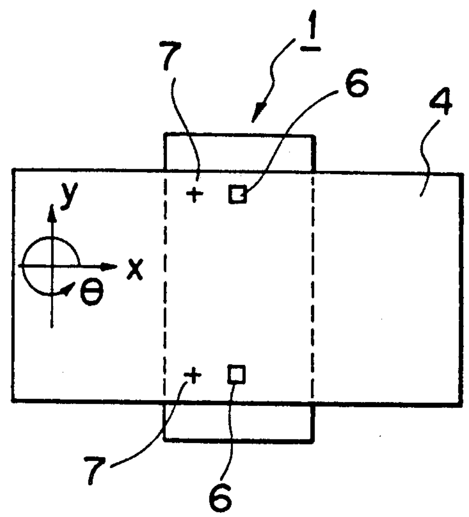
FIG. 2(A) and 2(B) are schematic views for illustrating the information obtained by an observation optical system with respect to the positional relation between a pattern side register mark and a work side register mark used in an embodiment of the transfer alignment method according to the present invention.
Figure 2B:
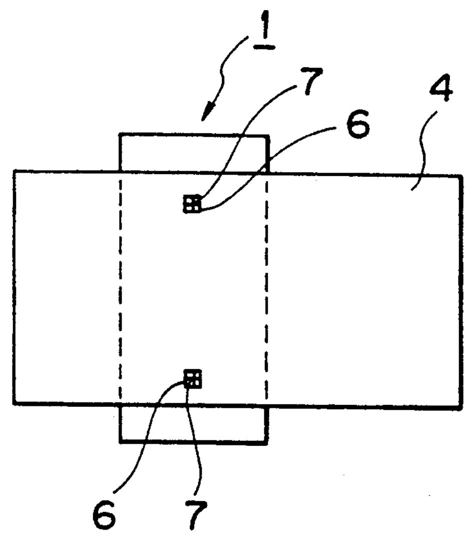

More specifically, when the information provided by the observation optical system 5 shows a positional difference between the pattern side register mark 6 and the work side register mark 7, e.g., as shown in FIG. 2(A), the work surface plate 3 or the roller 1 is moved to a position at which there is observed that the pattern side register mark 6 and the work side register mark 7 are superposed on each other as shown in FIG. 2(B), whereby the transferring pattern 2 and the work 4 are correctly positioned.

The work surface plate 3 or the roller 1 is moved in a horizontal direction (i.e., x-axis direction, Y-axis direction and a direction corresponding to an angle $\theta$ counted from the origin), and in a vertical direction (i.e., axis direction) in a space coordinate system (i.e., x-y-z coordinate system).

In this embodiment the work surface plate 3 or the roller 1 is moved not only in a horizontal direction (i.e., x-axis direction, y-axis direction and a direction corresponding to an angle $\theta$ counted from the origin) but also in a vertical direction (i.e., z-axis direction), so that there can be maintained a predetermined registration gap which is required for the exact observation effected by the observation optical system 5.

In the observation optical system 5, there may be used either transmission light or reflection light.

It is preferred that the registration between the transferring pattern 2 and the work 4 is effected corresponding to each of a plurality of pattern side register marks 6 provided on the transferring pattern 2 and a plurality of work side register marks 7 provided o the work 4. In such a case, the registration between the transferring pattern 2 and the work 4 may be effected as follows. Thus, as shown in FIGS. 3(A) to 3(D), the registration between the work side register mark (not shown) provided on an end of the work 4 and the pattern side register mark (not shown) corresponding to such a register mark is effected (FIG. 3(A)), the observation optical system is sequentially moved toward the movement direction of the roller 1 while the roller 1 is rotated and moved (FIGS. 3(B) and 3(C)), and the registration between the work side register mark provided on the other end of the work 4 and the pattern side register mark is effected (FIG. 3(D)). In FIGS. 3(B) to 3(D) used herein, the alignment shift quantity calculation unit 8, the stage control unit 9 and the stage driving unit 10 shown in FIG. 3(A) are omitted. It is also preferred to increase the number of the optical systems in a case where a plurality of register marks are studded, and a problem can occur in view of the alignment time and accuracy of measurement when the single optical system is moved as shown in these Figures.

After the registration between the transferring pattern 2 and the work 4 is effected in the manner as described above, the work surface plate 3 is moved in the z-axis direction as described above so that the work 4 is pressed to the transferring pattern 2, as shown in FIG. 1(B).

After such an operation, the transferring pattern 2 provided on the roller 1 and the work 4 disposed on the work surface plate 3 are pressed to each other so that the pattern side register mark 6 and the work side register mark 7 are superposed on each other.

In a case where a change in the registration position can mechanically occur in a period from the above registration operation to the pressing of the work 4 to the transferring pattern 2 based on the movement of the work surface plate 3 in the z axis direction, it is preferred to further continue the registration operation as described above.

When the registration operation is continued, it is possible to prevent the occurrence of a positional difference (i.e., so-called "image shift") which can occur in the period between the time at which the initial registration between the transferring pattern 2 and the work 4 is effected, and the time at which the work 4 and the transferring pattern 2 ar pressed to each other.

After the work 4 and the transferring pattern 2 are pressed to each other, the roller 1 is rotated while the pressing state is maintained so that the transferring pattern 2 is transferred to the surface of the work 4.

Accordingly, it is possible that the transferring pattern 2 is correctly transferred onto a predetermined position of the work 4 with high reproducibility.

Next, there will be described an alignment apparatus.

Figure 5:
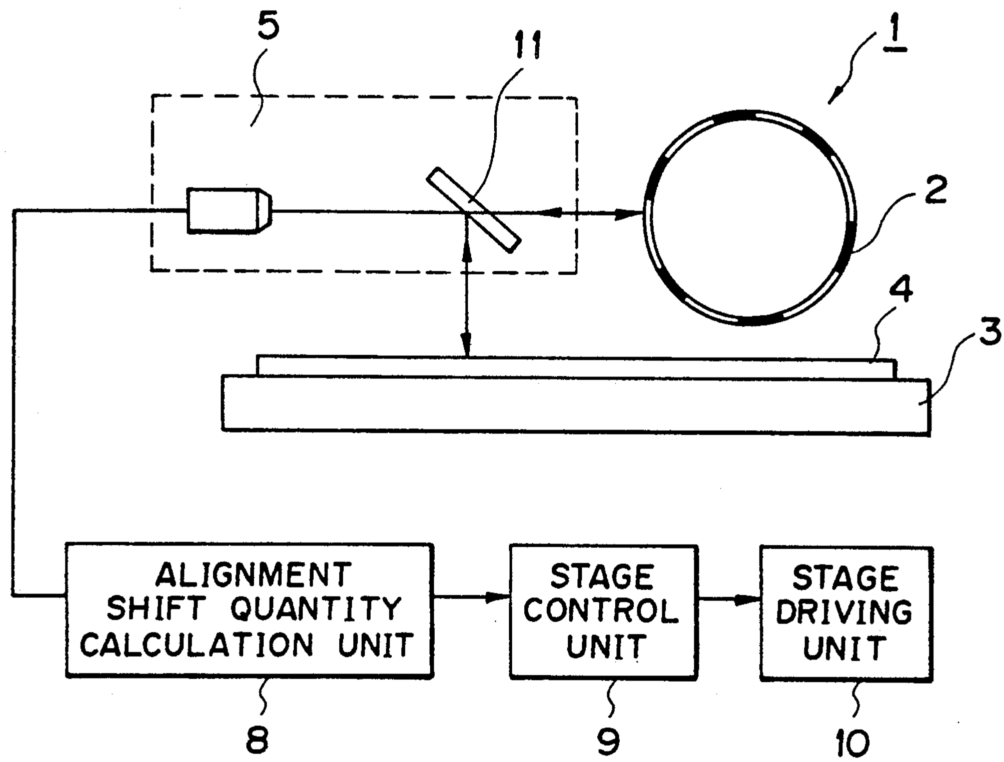
FIG. 5 is a schematic view for illustrating another embodiment of the structure of the alignment apparatus according to the present invention.
Figure 6:
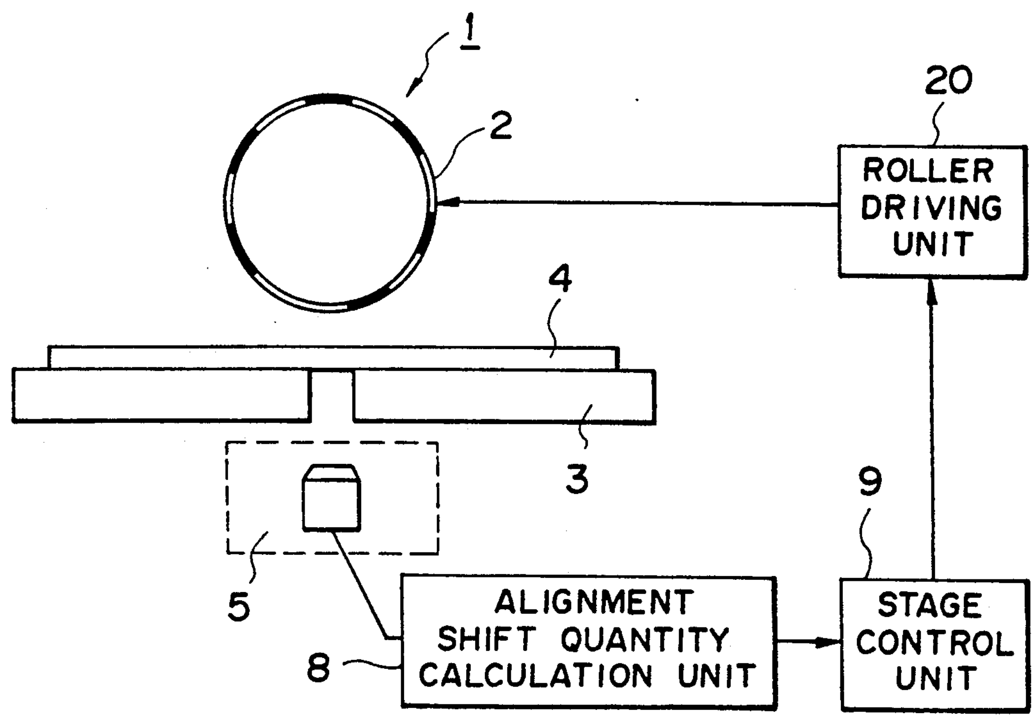
FIG. 6 is a schematic view for illustrating a further embodiment of the structure of the alignment apparatus according to the present invention.

As shown in FIGS. 4 and 5, the alignment apparatus according to the present invention comprises: an observation optical system 5 for optically observing a pattern side register mark (not shown) provided on a transferring pattern 2 on a roller 1, and a work side register mark (not shown) provided on a work 4 disposed on a work surface plate 3 disposed opposite to the roller 1; an alignment quantity calculation unit 8 for calculating a positional difference between the pattern side register mark and the work side register mark on the basis of the information provided by the observation optical system 5; a stage control unit 9 for outputting a control signal in accordance with the calculation result provided by the alignment quantity calculation unit 8; and a stage driving unit 10 for moving the work surface plate 3 to a position where the work side register mark and the pattern side register mark are superposed on each other, in accordance with the control signal output by the stage control unit 9. As shown in FIG. 6, the alignment apparatus may also comprise, in place of the above stage driving unit 10, a roller driving unit 20 for moving the roller 1 to a position where the work side register mark and the pattern side register mark are superposed on each other, in accordance with the control signal output by the stage control unit 9.

FIG. 4 is a schematic view for illustrating an embodiment of the structure of an alignment apparatus which uses transmission light in the observation optical system 5. FIG. 5 is a schematic view for illustrating an embodiment of the structure of an alignment apparatus which uses reflection light in the observation optical system 5.

The observation optical system 5 may be constituted, e.g., by use of a microscope, a CCD (charge coupled device), a half mirror, etc..

In a case where at least a portion of the work 4 for forming the work side register mark comprises a light transmissive material such as silica glass substrate, it is preferred to use transmission light in combination with the observation optical system 5.

In a case where at least a portion of the work 4 for forming the work side register mark comprises a light reflective material such as insulating ceramic substrate, it is preferred to use reflection light in combination with the observation optical system 5.

In a case where the transmission light is used in combination with the observation optical system 5 as shown in FIG. 4, it is generally required that an observation portion (opening or aperture) 3*a* is provided in the work surface plate 3. In such a case, it is possible to provide a plurality of the pattern side register marks 6 and/or a plurality of the work side register marks 7. On the other hand, in a case where reflection light is used in combination with the observation optical system 5 as shown in FIG. 5, the observation optical system may be constituted, e.g., by use of a half mirror 11. When the half mirror 11 is used, both of the work side register mark and the pattern side register mark may be observed by means of a single observation optical system 5.

The observation optical system 5 is movably supported with respect to the work surface plate 3.

By use of the above observation optical system 5, there may optically be observed a positional relation between the pattern side register mark 6 provided on the transferring pattern 2, and the work side register mark 7 provided on the work 4 disposed on the work surface plate 3.

The observation optical system 5 is connected with the alignment quantity calculation unit 8.

The alignment quantity calculation unit 8 calculates the positional difference between the pattern side register mark 6 and the work side register mark 7 with respect to the positional relation between the pattern side register mark 6 and the work side register mark 7 on the basis of the optical information provided by the observation optical system 5.

Figure 7:
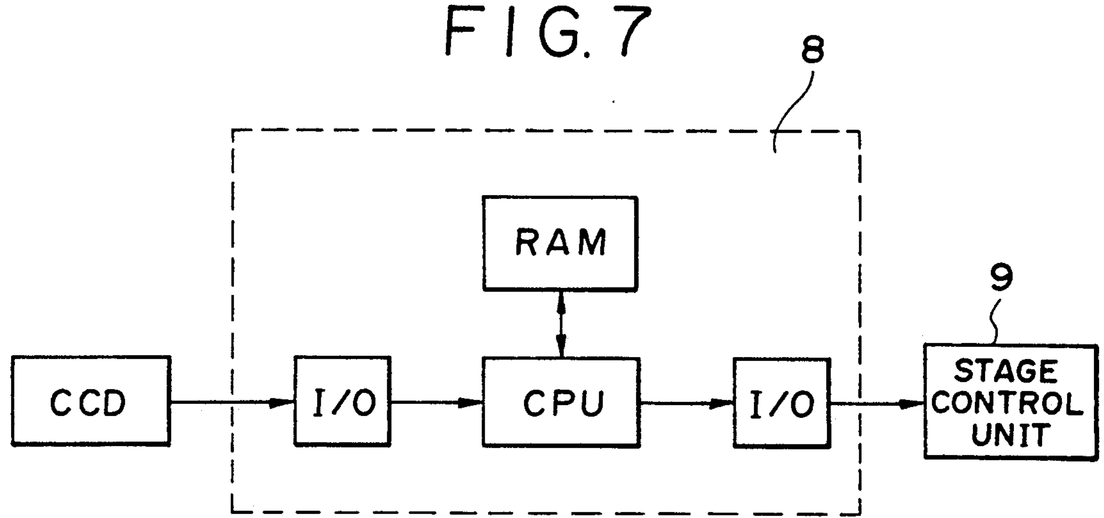
FIG. 7 is a schematic view for illustrating an embodiment of the alignment quantity calculation unit in the alignment apparatus according to the present invention.

The alignment quantity calculation unit 8 may be constituted, e.g., by use of an input/output interface (I/O), a central processing unit (CPU) and a random access memory (RAM) as shown in FIG. 7.

The positional relation between the pattern side register mark 6 and work side register mark 7 is calculated by means of the alignment quantity calculation unit 8 and the thus obtained calculation result is output to the stage driving unit as a control signal by the medium of the stage control unit 9.

More specifically, in the stage control unit 9, the stage driving unit 10 receives a control signal required for moving the work surface plate 3 to a position where the pattern side register mark 6 and the work side register mark 7 are superposed on each other, while retaining a predetermined registration gap, with respect to the positional relation, between the pattern side register mark 6 and the work side register mark 7 in a horizontal direction (i.e., x-axis direction, y-axis direction and a direction corresponding to an angle $\theta$ counted from the origin), and in a vertical direction (i.e., z-axis direction) in a space coordinate system (i.e., x-y-z coordinate system). The control signal relating to the vertical direction (z-axis direction) is one corresponding to the maintenance of the registration gap (represented by in FIG. 4) for exact observation by the observation optical system 5 and the pressing of the transfer pattern 2 to the work 4.

The stage driving unit 10 to be connected with the stage control unit 9 moves the work surface plate 3 to a position where the pattern side register mark 6 and the work side register mark 7 are superposed on each other, on the basis of the control signal as described above, and moves the work surface plate 3 until the work 4 disposed on the work surface plate 3 is pressed to the transfer pattern 2 on the roller 1. Further, it is also possible to move the roller 1 by means of the roller driving unit 20 for driving the roller 1 as shown in FIG. 6.

In the alignment apparatus according to the present invention, it is preferred that the registration operation as described above can further be continued in a period of from the above registration operation between the transfer pattern 2 and the work 4 to the pressing of the work 4 to the transfer pattern 2 based on the movement of the work surface plate 3 in the above z-axis direction.

In order to continue the above registration operation, it is possible to provide a feed back function which is capable of feeding back to the stage driving unit 10 a control signal output by the stage control unit 9 on the basis of the calculation result provided by the alignment quantity calculation unit 8 for processing the optical information provided by the observation optical system 5, in a period of from the registration between the transfer pattern 2 and the work 4 to the pressing of the work 4 to the transfer pattern 2 based on the movement of the work surface plate 3 in the above z-axis direction.

The stage driving unit 10 or the roller driving unit 20 may be constituted, e.g., by use of various motors such as a linear motor and a pulse motor capable of providing a minute step.

The alignment apparatus according to the present invention is preferably applicable to various roller transfer methods, and is particularly applicable to the transfer alignment method according to the present invention.

There will be described another embodiment of the transfer alignment method according to the present invention with reference to FIGS. 8 to 11.

Figure 8:
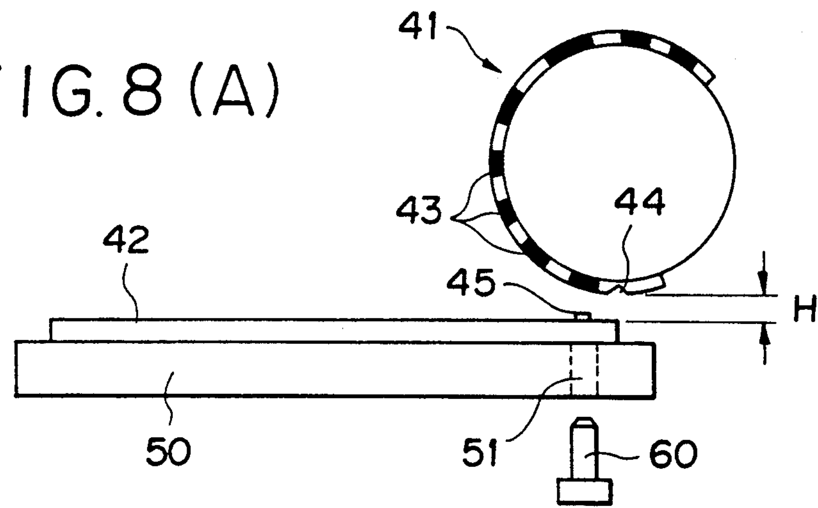
FIGS. 8(A) to 8(D) are schematic views for sequentially illustrating the relation between a work and a pattern transferring plate in each of sequential steps used in an embodiment of the transfer alignment method according to the present invention.
Figure 8:
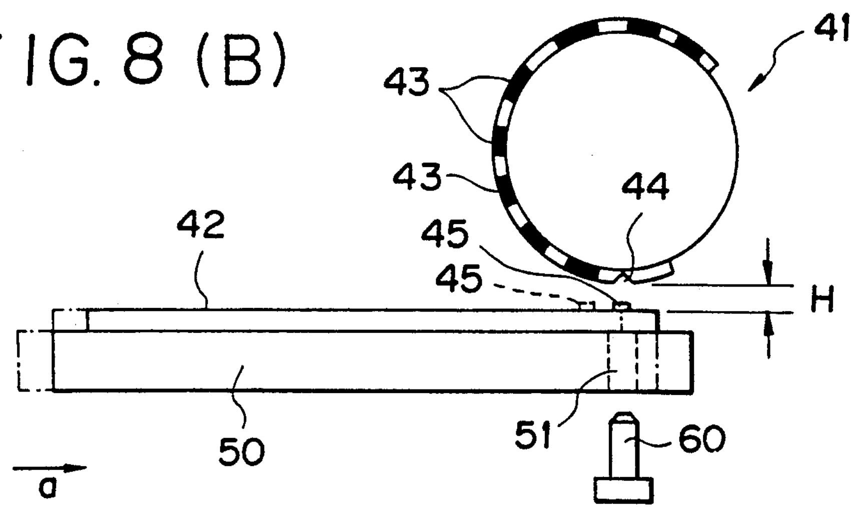

FIG. 8 schematically shows a relation between a roller 41 as a pattern transferring plate and a transfer receiving flat plate 42 as a work.

As shown in FIG. 8(A), at first, the roller 41 is disposed opposite to the transfer receiving flat plate 42 with a predetermined registration gap H therebetween.

In the roller 41, a transfer pattern 43 which is transferable to the transfer receiving flat plate 42 is provided, and a pattern side non-adhesive register mark 44 is formed in a non-transfer region so as to effect exact registration with the transfer receiving flat plate 42. The non-transfer region used herein is a region (or portion) which has no adhesion property to the transfer receiving flat plate 42.

The transfer pattern 43 may preferably be formed by using various printing inks or metal thin films as described hereinafter. However, when the transfer pattern 43 is formed by use of a metal thin film, it is necessary to provide an appropriate adhesive layer on a surface of the metal thin film contacting the transfer receiving flat plate 42 or a surface of the transfer receiving flat plate 42 contacting the metal thin film, as described hereinafter. The adhesive layer may for example comprise a universal adhesive (agent) such as vinyl chloride vinyl acetate type. natural rubber type, synthetic rubber type, various acrylate types, and epoxy type; a heat sensitive thermoplastic adhesive, a light curing (or light hardening) adhesive, or an electrodeposition resin based on electrophoresis, etc..

The transfer pattern 43 and the above adhesive layer each having an adhesive property to the transfer receiving flat plate 42 is not formed on the pattern side non-adhesive register mark 44.

If the transfer pattern 43 or the above adhesive layer is formed on the pattern side non-adhesive register mark 44, there can be posed a problem as described hereinafter. More specifically, when the non-transfer region of the roller 41 is caused to closely contact a non-adhesive region of the transfer receiving flat plate 42 on which a work side non-adhesive register mark 45 is formed to correctly position the roller 41 relative to the transfer receiving flat plate 42 as described hereinafter, the non-transfer region is bonded to the transfer receiving flat plate 42. As a result it is not possible to repeat the positioning operation.

Similarly, the work side non-adhesive register mark 45 formed on the non adhesive region of the transfer receiving flat plate 42, i.e. the region thereof having no adhesive property to the roller 41, has no adhesion property to the transfer receiving flat plate 42. Accordingly, the adhesive layer is not provided on the work side non adhesive register mark 45, even when an appropriate adhesive layer is provided on the transfer receiving flat plate 42.

In FIGS. 8(A) to 8(D), the reference numeral 50 denotes a work surface plate for retaining the transfer receiving flat plate 42, and the reference numeral 51 denotes an observation hole (or through hole) provided in the work surface plate 50. The transfer receiving flat plate 42 used in this embodiment is transparent.

Then, there is effected a positioning operation (or registration) between the roller 41 and the transfer receiving flat plate 42.

In such a case, the positioning between the roller 41 and the transfer receiving flat plate 42 disposed opposite to each other with a registration gap H may be effected in the following manner.

First, as shown in FIG. 8(A), in a state where the registration gap H is retained, the positional relation between the pattern side non-adhesive register mark 44 provided in the non-transfer region of the roller 41 and the work side non-adhesive register mark 45 provided in the non-adhesive region of the transfer receiving flat plate 42 is optically observed with, e.g., an observation optical system 60. At least one of the roller 41 and the transfer receiving flat plate 42 is moved to a position where a predetermined relation between the pattern side non-adhesive register mark 44 and the work side non-adhesive register mark 45 is observed, in accordance with the information provided by the above observation optical system 60.

Figure 9A:
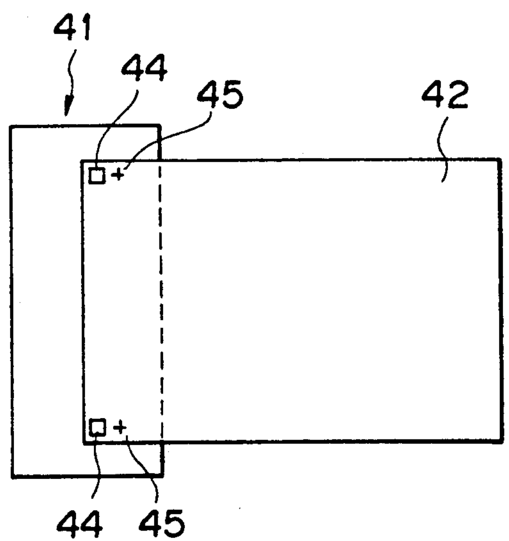
FIGS. 9(A) and 9(B) are schematic views for illustrating the information obtained by an observation optical system with respect to the positional relation between a pattern side non-adhesive register mark and a work side non-adhesive register mark used in an embodiment of the transfer alignment method according to the present invention.
Figure 9B:
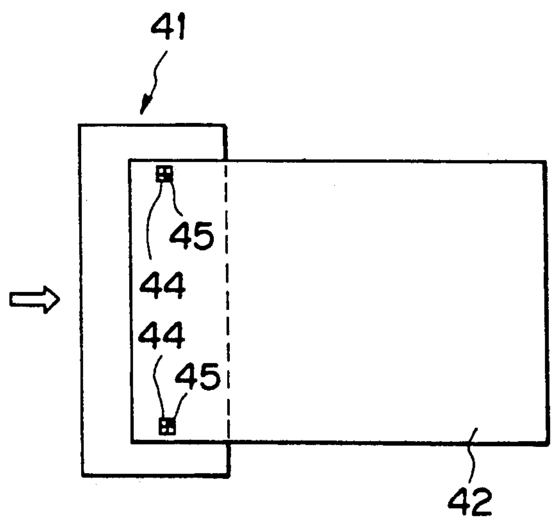
Figure 10:
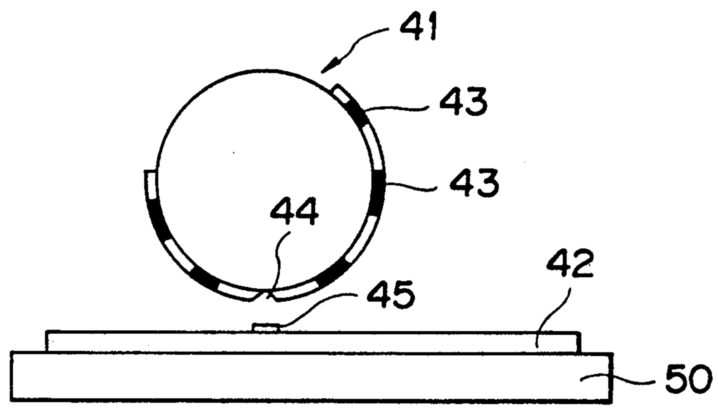
FIGS. 10(A) to 10(D) are schematic views for illustrating the relation between the pattern transferring plate and the work according to an embodiment of the transfer alignment method of the present invention wherein the registration operation is repeated.
Figure 10:
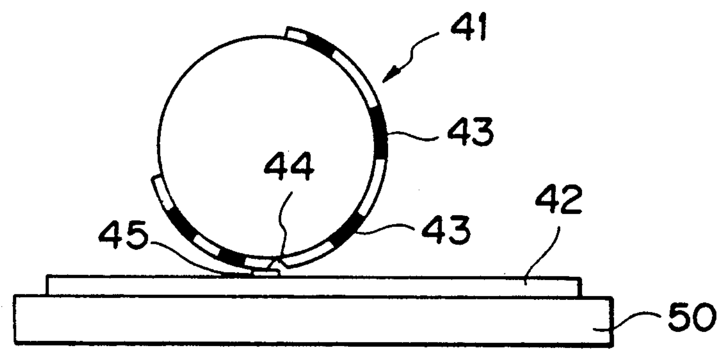
Figure 10:
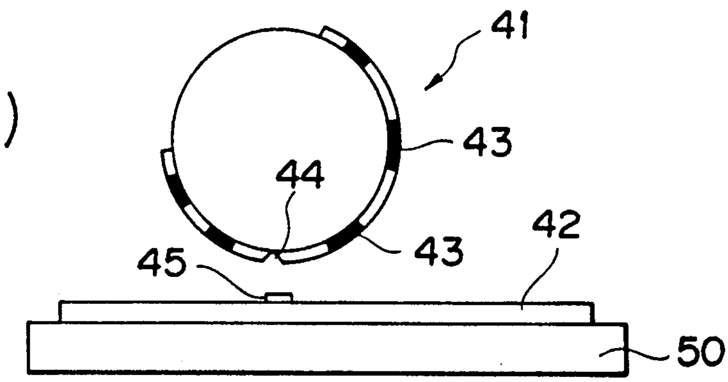
Figure 10:
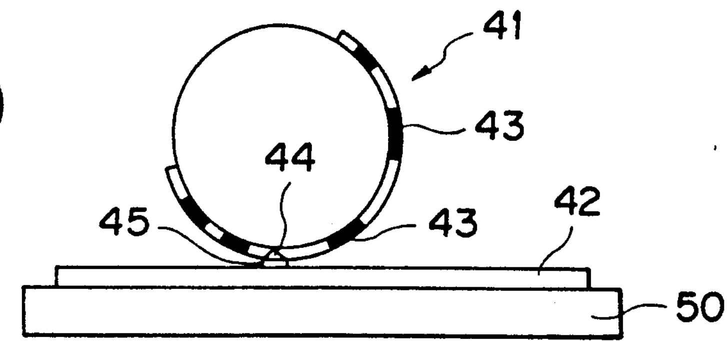

More specifically, when there is a difference in the positional relation between the pattern side non-adhesive register mark 44 provided on the non-transfer region of the roller 41 and the work side non-adhesive register mark 45 provided on the non-adhesive region of the transfer receiving flat plate 42, as shown in FIG. 9(A), at least one of the roller 41 and the transfer receiving flat plate 42 is moved to a position where a predetermined relation between the pattern side non-adhesive register mark 44 and the work side non-adhesive register mark 45 is observed, as shown in FIG. 9(B). In this embodiment, as shown in FIG. 8(B), the work surface plate 50 carrying thereon the transfer receiving flat plate 42 is moved from a position denoted by a long and short dash line to a position denoted by a solid line (or full line) in a direction of an arrow a.

Figure 8C:
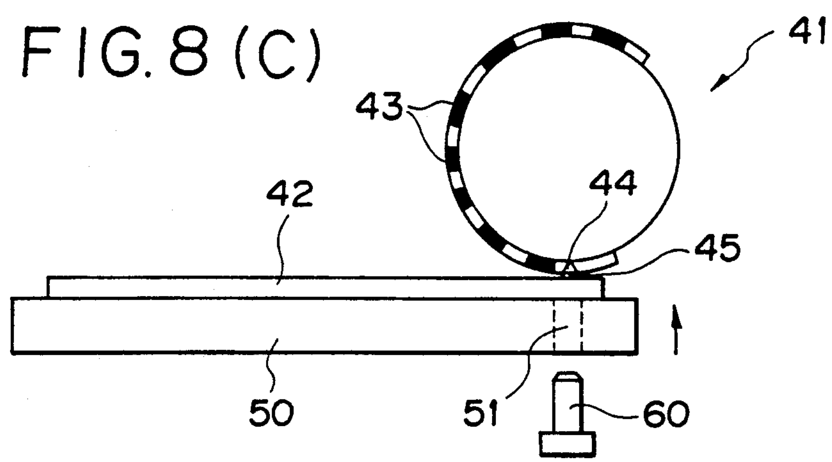

Then, as shown in FIG. 8(C), the non-transfer region on which the pattern side non-adhesive register mark 44 is formed is caused to closely contact the non-adhesive region on which the work side non-adhesive register mark 45 is formed.

In a case where the pattern transferring plate comprises a cylindrical surface or a portion thereof as in the case of the roller 41 used in this embodiment, in general, there may be provided a positional difference (or so-called image shift between the position provided at the time at which the positional relation between the pattern side register mark 44 and the work side register mark 45 is observed, and the position provided at the time at which the roller 41 is pressed to the transfer receiving flat plate 42. When such en image shift occurs, the positioning between the roller 41 and the transfer receiving flat plate 42 is repeated as shown in FIGS. 10(A) to 10(D).

For example, as shown in FIG. 10(A), the work surface plate 50 carrying and supporting thereon the transfer receiving flat plate 42 is moved to a position where the matching between the pattern side non-adhesive register mark 44 and the work side non-adhesive register mark 45 is observed.

Then, as shown in FIG. 1O(D), at this position, the non-transfer region of the roller 41 on which the pattern side non adhesive register mark 44 is formed is closely caused to contact the non-transfer region of the transfer receiving flat plate 42 on which the work side non-adhesive register mark 45 is formed.

At this time, if the so-called image shift as described above is observed, the roller 41 is separated from the transfer receiving flat plate 42 as shown in FIG. 10(C)so as to move the work surface plate 50 or the roller 41 to a position where the above image shift is reduced. Herein, the non-transfer region on which the pattern side non adhesive register mark 44 is formed and the non-transfer region on which the work side non-adhesive register mark 45 is formed have no adhesion property to the transfer receiving flat plate 42 and the roller 41, respectively. Accordingly, the roller 41 may easily be separated from the transfer receiving flat plate 42, so that the positioning can be effected many times as desired until the image shift is corrected.

More specifically, the positioning is completed at the time when the roller 41 is again caused to closely contact the transfer receiving flat plate 42 and the correction of the image shift is confirmed, as shown in FIG. 10(D).

It is preferred to effect the above registration with respect to a plurality of combinations of the pattern side non-adhesive register mark 44 and the work side non-adhesive register mark 45.

The observation optical system 60 may be constituted, e.g., by use of a microscope, a CCD (charge coupled device), etc., similarly as in the case of the observation optical system 5 as described hereinabove. Further, it is possible to constitute the observation optical system 60 by suitably using a known laser optical system. Particularly, a control mechanism based on a known laser optical system is advantageous to the positioning with high precision. It is preferred to provide at least two observation optical systems 60. When two or more observation optical systems 60 are provided, it is possible to simultaneously effect observation at a plurality of positions. However, even in a case where only a single observation optical system 60 is provided, it is possible to effect observation at a plurality of positions if the observation optical system 60 is movable.

Figure 11:
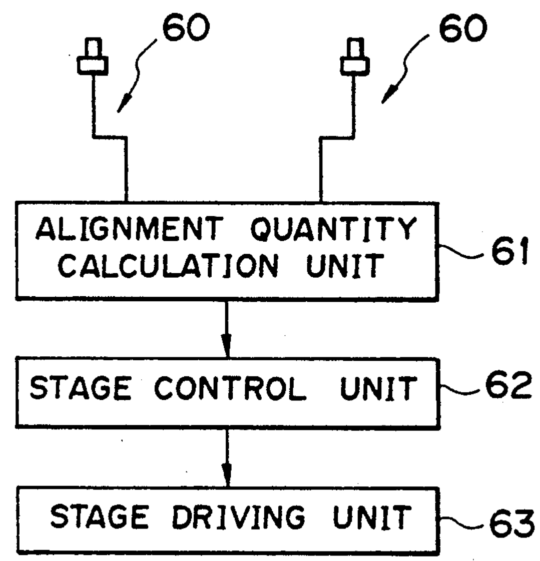

In order to move at least one of the roller 41 and the transfer receiving flat plate 42 in accordance with the information provided by the observation optical system 60, for example, it is possible to connect the observation optical system 60 with the stage moving mechanism 63 by the medium of the alignment quantity calculation unit 61 and the stage control unit 62, as shown in FIG. 11.

The alignment quantity calculation unit 61 has a function of calculating the positional difference between the pattern side non-adhesive register mark 44 and the work side non-adhesive register mark 45 on the basis of the optical information provided by the observation optical system 60.

The alignment quantity calculation unit 61 may be constituted. e.g., by use of an input/output interface (I/O), a central processing unit (CPU) and random access memory (RAM), similarly as in the case of the quantity calculation unit 8 as described above.

The calculation result provided by the alignment quantity calculation unit 61 is output to the stage moving unit 63 as a control signal by the medium of the stage control unit 62.

More specifically, in the stage control unit 62, the stage driving unit 63 receives a control signal required for moving the work surface plate 50 to a position where the superposition of the pattern side non-adhesive register mark 44 and the work side non-adhesive register mark 45 is observed while retaining a predetermined registration gap H with respect to the positional relation between the pattern side non-adhesive register mark 44 and the work side non-adhesive register mark 45 in a horizontal direction (i.e., x-axis direction, y-axis direction and a direction corresponding to an angle $\theta$ counted from the origin), in a two dimensional system (i.e., x-y coordinate system). The work surface plate 50 has a function of supporting the transfer receiving flat plate 42 and is movable by means of the stage moving mechanism.

The stage moving mechanism 63 may be constituted. e.g., by use of various motors such as a linear motor and a pulse motor capable of providing a minute step.

Figure 8D:
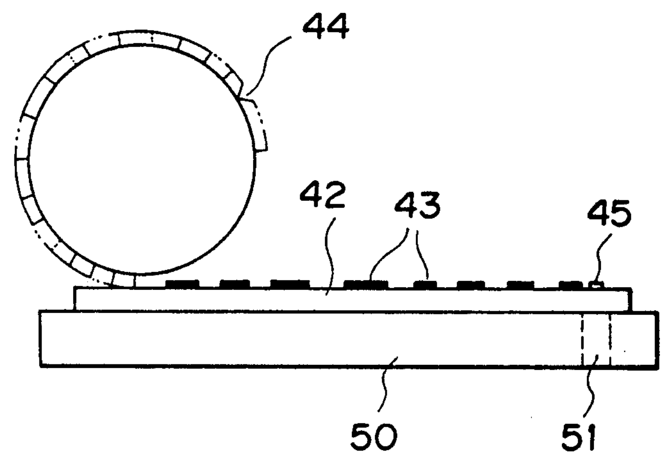

After the registration between the roller 41 and the transfer receiving flat plate 42 is effected in the manner as described above, the roller 41 is pressed to the transfer receiving flat plate 42 as shown in FIG. 8(D). whereby the transfer pattern 43 is transferred to the transfer receiving flat plate 42.

The above pressing can be effected while sequentially shifting the contact face between the pattern transfer plate and the work, when the plate surface of the pattern transferring plate, comprises a curved surface of the roller 41 as in the case of this embodiment. When the plate surface of the pattern transferring plate comprises a flat surface, the pressing can be effected simultaneously over the entire contact face between the pattern transferring plate and the work, or can sequentially be effected by locally pressing the contact face therebetween. In addition, it is also possible that a pattern transferring plate 71 comprising a portion of a cylindrical surface is used as shown in FIGS. 12(A) and 12(B), and the inside of the transferring plate 71 is locally pressed by means of a pressing roller 80, whereby the transfer pattern 73 is sequentially pressed to the work 72. In FIGS. 12(A) and 12(B), the reference numeral 90 denotes an adhesive layer.

The transfer pattern which is transferred to a predetermined position of the work in the manner as described above is excellent in the positioning precision and the reproducibility therefor, and may satisfy the level of the positioning precision and reproducibility therefor (1 to 5 $\mu$m. for example), required for an electroconductive minute pattern for a thin film semiconductor element, etc..

Next, there will be described the formation of the transfer pattern 2 and 43 as described above.

Figure 13:
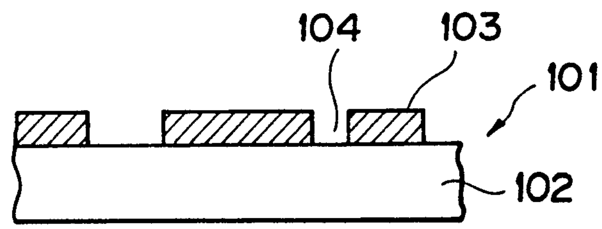
Figure 13:
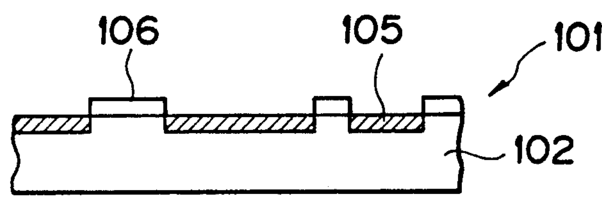
Figure 13:
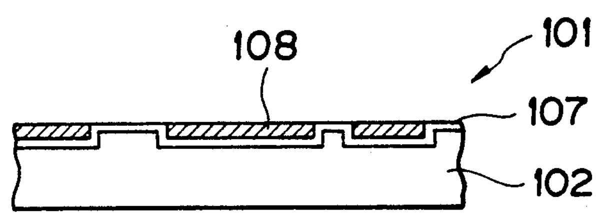

FIG. 13 is a schematic sectional view showing an embodiment of the structure of a pattern transfer plate in a flat form. First, a pattern transferring plate 101 as shown in FIGS. 13(A), 13(B) or 13(C) is prepared. The pattern transferring plate 101 used herein is not restricted to one having a flat form as shown in these Figures but may for example be a cylindrical plate comprising a rubber roller and a plate wound a round such a roller. In FIG. 13(A), the pattern transferring plate 101 comprises a substrate 102 having an electroconductivity and a desired resist pattern disposed thereon which has been formed by an ordinary photolithographic method such that a photoresist is applied onto the substrate 102, the resultant coated substrate is exposed to a desired image pattern and is subjected to developing and drying, and is further subjected to baking, as desired.

The substrate 102 having an electroconductivity may comprise an electroconductive material such as metal plate, or may comprise a member comprising a substrate of a non-conductive material at least surface of which is supplied with an electroconductivity by bonding, coating or vapor deposition (or vacuum deposition) of a conductive member (or material) such as tin oxide, indium tin oxide, (ITO), and carbon. The above electroconductive surface may preferably assume a state capable of providing an adhesion strength such that an electrodeposition substance deposited by an electrolysis step which is to be effected subsequently may adhere thereto with an appropriate strength, and such a substance may easily be peeled in a subsequent transfer step. Accordingly,, the surface of the substrate 102 may be subjected to mirror finish (or mirror polishing) so as to provide a low adhesion strength, and then may be used in such a state for the above purpose. In consideration of the above factors, when the material of the substrate 102 comprises a metal, it may preferably comprise a stainless steel plate or copper plate coated with nickel plating or chromium plating having an appropriate adhesion strength. Further, the photoresist used for such a purpose may be a resist having a good electrical insulating property.

According to the above step, there are formed on the substrate 102 an electrical insulating photoresist pattern 103 and a line image portion 104 in which the electroconductive surface is provided, in the next process, by the deposition of the electrodeposition substance based on an electrolysis reaction.

On the other hand, the pattern transferring plate 101 as shown in FIG. 13(B) may be formed by forming a concavity in the electroconductive substrate 102 by chemical milling or etching based on photoetching, by mechanical cutting, etc.; filling the resultant concavity with a substance 105 having a good adhesion property and a good insulating property; and then subjecting the resultant product to hard chromium (or chrome) plating to form a chromium layer 106. The portion filled with the above substance 105 forms a non-line image portion, and the portion supplied with the chromium layer forms, a line image portion. When the hard chromium plating is effected in such a manner, the printing repeatability, i.e., printing resistance may be improved.

Further, the pattern transferring plate 101 as shown in FIG. 13(C) may be formed by forming a concavity in the electroconductive substrate 102 by a similar method of as in the case of FIG. 13(B); subjecting the entire surface of the substrate 102 provided with the concavity to hard chromium (or chrome) plating to form a chromium layer 107; and filling the resultant concavity with a substance 108 having a good adhesion property and a good insulating property.

In the description appearing hereinafter, the pattern transferring plate 101 as shown in FIG. 13(A) is used. However, as a matter of course, the following description is similarly applicable to the printing plate as shown in FIG. 13(B) or FIG. 13(C).

The pattern transferring plate 101 is prepared in the manner as described above. Then, an electrolyte liquid 111 containing an electrodeposition substance component is charged into an appropriate electrolytic cell 110, the pattern transferring plate 101 is used as an electrode on one side, and an electroconductive member comprising an appropriate material is used as the electrode 112 on the other side, as shown in the sectional view of FIG. 14. Thereafter, a DC power supply 113 is connected with these electrodes, and electrolysis is conducted under a proper voltage so as to provide a proper current. As a result, as shown in the sectional view of FIG. 15, the electrodeposition substance 114 is deposited on the line image portion 104 shown in FIG. 13(A).

As a matter of course, the material usable as the electrodeposition substance is one capable of showing an electrochemical behavior and being deposited on one electrode side. In general, metals are known as materials for electroplating. As such metals, universal materials may widely be used. In the present invention, however, it is preferred to use Ni, Cr, Fe, Ag, Au, Cu, Zn, Sn, or compounds or alloys containing at least one of these metals. The reason for this is that these metals may provide good properties after the electrodeposition such as film forming property, thin film shielding property and resolution (or resolving power).

On the other hand, an electrodeposition substance comprising organic materials (or polymer materials) is known. In the prior art, there has been a report wherein various vinyl compounds are electrochemically polymerized on an Fe electrode thereby to obtain a polymer film Metal Surface Technique (Kingoku Hyomen Gijutsu) Vol. 19, No. 12, 1968). Recently, there have been conducted researches wherein an electroconductive polymer film comprising polypyrrole or polythienylene is formed from pyrrole or thiophene on an electrode.

As another method, there is known a method wherein a polymer is deposited from a polymer solution on an electrode by using insolubilization thereof. For example, there is well known an electrodeposition coating method wherein a colored pigment is dispersed in a polymer solution and a colored coating film is formed on an electrode by using such a solution. Accordingly, in general, it is possible to use a material which has been developed to be used for the electrodeposition coating of an automobile.

The electrodeposition may be classified into cationic electrodeposition and anionic electrodeposition depending on the reaction between the electrodeposition substance and a main electrode as an electrodeposition electrode, i.e., depending on whether the electrodeposition substance is present as a cation or it behaves as an anion.

Specific examples of the organic polymer substances usable in the electrodeposition may include: natural fat and oil type, synthetic fat and oil type, alkyd resin type, polyester resin type, acrylic resin type, epoxy resin type, etc.

In the anionic type, there have been known maleic modified oils and polybutadiene type resins. In such a case, the curing (or hardening) is based on an oxidation polymerization reaction.

The cationic type has widely been used for general electrodeposition coating. In such a case, an epoxy resin may mainly be used as such or after the modification thereof. The curing thereof is generally effected by using a crosslinking agent of an isocyanate type. In addition, there may mainly be used polybutadiene type resins and so-called polyamino type resins such as melamine type resin and acrylic type resin.

These electrodeposition films may be cured (or hardened) by oxidation polymerization, thermal polymerization, or photopolymerization, etc., thereby to form a film having good corrosion resistance. Particularly, an anionic type acrylic resin has been disclosed as an ultraviolet ray curing electrodeposition resin for forming negative type image.

As described above, the transfer pattern may generally be formed as a metal or organic resin film on the pattern transferring plate, but the electrodeposition substance generally has no adhesion property. When a viscous substance having a tackiness or adhesiveness is used as described hereinabove, it is difficult to faithfully reproduce the transfer pattern at the time of the transfer thereof. Accordingly, in this embodiment, the above solid pattern is used so as to prevent the deformation thereof based on an external force such as pressure. Accordingly, the pattern substance per se has no adhesiveness or tackiness, or has very little adhesiveness or tackiness, if any.

Therefore, in order to transfer the deposited electrodeposition substance, it is necessary to subsequently impart adhesiveness or tackiness to such a substance. In such a case, it is possible to use a method wherein a tackifying agent or adhesive agent is applied to the work surface or the pattern transfer surface after the electrodeposition.

The tackifying agent may for example comprise a universal adhesive (agent) such as vinyl chloride vinyl acetate, natural rubber type, sysnthetic rubber type, various acrylate types, and epoxy type; m heat sensitive thermoplastic adhesive, or a light curing (or light hardening) adhesive, etc..

The non-line image portion of the adhesive layer which has been formed for the purpose of transferring the electrodeposition pattern, is not necessary for the etching of the work surface. Accordingly, it is necessary to remove the adhesive layer in the non-line-image-portion. As a method for effecting such removal, it is convenient to use a dry etching method in combination with a plasma incineration method in the presence of oxygen. In such a case, the organic electrodeposition substance is also subjected to incineration. However, since the electrodeposition substance layer has a larger thickness than that of the adhesive layer, the adhesive layer may be removed prior to that of the electrodeposition substance layer, even when the incineration velocities for these layers are the some.

In practice, the resistance to the incineration may be imparted to the electrodeposition substance layer by selecting the electrodeposition agent and mixing therewith a substance (such as fine inorganic material) which provides a small incineration velocity or is not subjected to incineration.

In a case where the electrodeposition substance comprises a metal, when the surface of the substrate for the electrodeposition is subjected to an appropriate release treatment or is provided with a conductive face having little compatibility with the electrodeposition metal, it is possible to obtain an adhesion property which is capable of attaining easy electrodeposition and easy transfer. For example, it is possible to use chromic acid treatment, mirror surface nickel plating chromium plating, or a metal substrate such as stainless steel plate which originally shows poor adhesion to the electrodeposition metal.

On the other hand, the organic electrodeposition material based on the material for the electrodeposition coating, which is to be used for such a purpose, mostly shows good adhesion to the electrodeposition substrate. In such a case, even when a transfer adhesive layer is disposed between the work surface and the electrodeposition substance deposited thereon by the electrodeposition, the adhesion between the electrodeposition substance and the substrate can be too strong in some cases so that it cannot be subjected to peeling and transferring, or is partially broken and subjected to the transferring. As a result, good pattern transfer cannot be effected in some cases.

In such a case, it is preferred that the substrate is preliminarily provided with a thin metal film comprising a metal which has a poor compatibility with the metal material of the substrate and has a good releasability, by primary electrodeposition, and then the resultant product is provided with the intended organic electrodeposition substance by secondary electrodeposition. When such electrodeposition substance is intended to be transferred by the medium of the adhesive layer, it may easily be peeled at the interface between the substrate and the primary electrodeposition metal to be transferred. After the transfer, the resultant coating comprises the organic electrodeposition substance covered with the primary electrodeposition metal.

Accordingly when the primary electrodeposition metal is removed by etching after the transfer operation, an intended pattern of the organic electrodeposition substance may be obtained. In such a case, the electrodeposition substance is transferred while being covered with the primary electrodeposition metal, thereby to provide an excellent image pattern without the breakage or deformation of the electrodeposition substance.

As such a primary electrodeposition metal aiding the above peeling and transferring, it is possible to use all of the metals described above as general releasing electrodeposition metals. However, it is preferred to use a metal such that it may be used in a less hazardous etching liquid and may easily be subjected to the etching, when removed by etching after the transfer operation. For example, metals such as Ag, Ni and Cu may particularly preferably be used for such a purpose. However the metals usable for such a purpose should not be restricted to these metals.

When the above method using the peelable primary metal electrodeposition is used, the transfer may completely be effected even in the case of a material showing a relatively poor film forming property at the time of the electrodeposition. Accordingly, it is possible to obtain a line image without a pin hole or unevenness.

Next, there will be described the formation of the transfer pattern on a curved pattern transfer plate such as roller.

FIG. 16(A) and 16(B) are schematic sectional views each showing an embodiment of the structure of a pattern transferring plate in a roller form. In FIG. 16(A), the roller 131 is one comprising the electroconductive material as described above or one comprising a roller having no conductivity and a conductive film disposed on the peripheral surface thereof. On the roller 131, in a similar manner as in the case of the flat pattern transferring plate as described above, a photoresist is applied onto the roller 131, the resultant coated roller is exposed to a desired image pattern and is subjected to developing and drying operations, and is further subjected to baking, as desired, whereby a desired resist pattern is formed. Then, in a similar manner as in the case of the flat pattern transferring plate as described above, an electrodeposition substance 135 is deposited on a line image portion 133 wherein the conductive surface of the roller 131 is exposed, as shown in FIG. 16(B). It is also possible to apply a tackifying agent or adhesive agent onto the pattern transferring plate in a roller form in a similar manner as in the case of the flat pattern transferring plate as described above. In addition, it is possible that a thin metal film comprising a metal which has a low affinity to the surface metal of the roller and has a good releasability is formed on the line image 133 by primary electrodeposition, and then a film of an organic electrodeposition substance is formed on the resultant film by secondary electrodeposition.

Next, there will be described another embodiment for forming a transfer pattern on a pattern transfer plate.

FIG. 17(A) to 17(E) are schematic views for illustrating steps for forming a transfer pattern on a flat pattern transferring, plate.

FIG. 17(A) shows a flat pattern transferring plate 141. The plate 141 may comprise an intaglio plate as shown in the Figure or planographic plate as described hereinafter. The plate 141 used herein is not restricted to one having a flat form as shown in the Figure but may for example be a cylindrical plate comprising a rubber roller and a plate wound around such a roller.

When the plate 141 comprises an intaglio plate, concavities 142 capable of providing a printing line image are formed on the intaglio plate 141. When the plate 141 comprises a planographic plate, pattern portions corresponding to the above concavities 142 are formed on the planographic plate. The method of formation of the concavities 142 is not particularly restricted. The concavities may for example be formed by cutting a smoothly ground metal plate material (generally, a metal such as copper, copper alloy, iron, and iron alloy) by a fine cutting method, or by optically forming a resist mask on the plate material, and then subjecting the resultant material to etching. The concavities 142 may be formed as fine (or minute) concavities having a line width of about 5 to 50 μm, and a depth (plate depth) of about 1 to 10 μm. The plate material may also comprise a hard material such as glass, ceramic and metal, or a material having a flexibility such as metal thin plate and plastic film. Further, in order to enhance the hardness of the surface of the intaglio plate 141, the surface may be coated with plating of a hard metal such as nickel and chromium. In such a case, the plate surface may be supplied with resistance to ink scraping effected by a doctor. In order to form a pattern portion of the planographic plate, it is possible to use a known plate making method used for planographic printing.

Then, a curing type ink 143 is applied onto the surface of the above pattern transferring plate (intaglio plate) 141, as shown in FIG. 17(B). The application of the ink may easily be effected by dipping the plate into an ink reservoir, or by pouring the ink over the plate surface.

The ink used for such a purpose may be a heat curing (or hardening) type, ionizing radiation curing type, etc., and may preferably be one of a solventless type having a relatively low viscosity. Specific examples of the ink to be used for such a purpose may generally include commercially available inks such as ultraviolet ray curing ink, electron beam curing ink, and infrared ray (or heat) curing type. The present invention is also advantageous because it may use the known inks as described above. In the case of the ultraviolet ray curing ink, the basic composition of the ink 143 contains no solvent and comprises a photosensitive prepolymer (or a monomer and a photopolymerization initiator) as a binder, a coloring pigment and an appropriate ink aid such as sensitizer and tackiness regulating agent. It is also possible to use one selected from photoresist materials used for semiconductor processing, photoetching, etc., in place of the ordinary ultraviolet ray curing ink. In addition, it is not necessary to use a high viscosity ink as in the conventional planographic printing process but an ink having a somewhat low viscosity is also usable. The viscosity of the ink may be regulated by selecting, as a binder, a low viscosity prepolymer or a monomer containing a photopolymerization initiator.

In a case where the plate 141 comprises an intaglio plate, after the application of the ink 143 to the plate 141, the unnecessary ink 143*a* disposed on the surface of the intaglio plate 141 is scraped off with a doctor blade 144 comprising a thin metal blade, etc., to be removed therefrom, as shown in FIG. 17(C), and the concavities 142 capable of providing a printing line image are selectively filled with the ink 143. On the other hand, in a case where the plate 141 comprises a planographic plate, the curing type ink 143 applied thereonto selectively adheres to the pattern portion spontaneously on the basis of the interaction between the surface energy of the plate and that of the ink, as shown in FIG. 17(D). In each of the above plates, the ink 143 is subjected to patterning at this step, thereby to form a transfer pattern.

Then, as shown in FIG. 17(E), the ink 143 disposed in the concavity 142 ,is subjected to curing treatment by using irradiation thereof with heat or radiation 145 to reaction activate the ink so that a viscosity increasing reaction or curing reaction is caused to occur in the concavity 142 and the fluidity of the ink is removed to form a cured (or solid) ink 143*b*. In the case of the planographic plate, as shown in FIG. 17(D), a viscosity increasing reaction or curing reaction occurs on the plate on the basis of the irradiation thereof with heat, radiation or electron beam 145 in the same manner as in the case of the intaglio plate, and the ink 143 subjected to the patterning is converted into the cured ink (or transfer pattern) 143*b*. At this time, the degree of curing may preferably be 90% or higher as a whole in terms of gel fraction.

Figure 17:
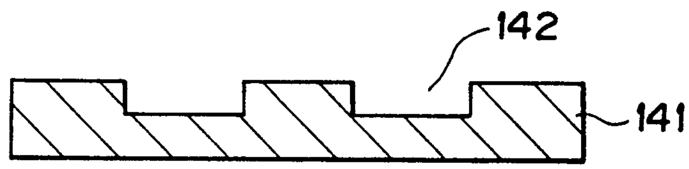
Figure 17:
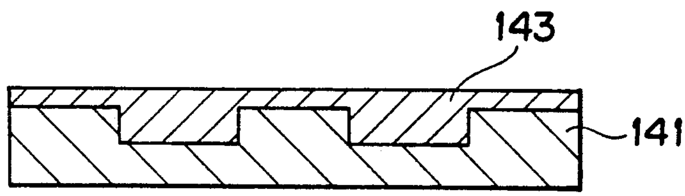
Figure 17:
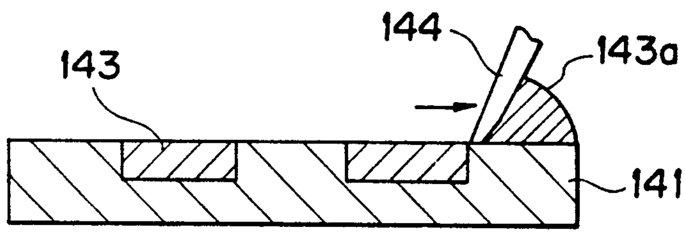
Figure 17:
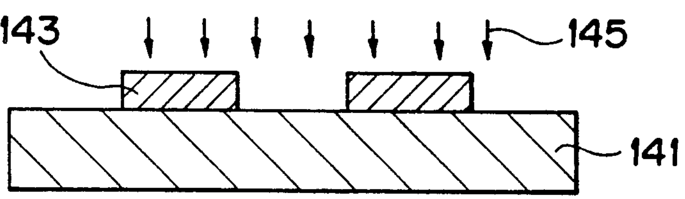
Figure 17:
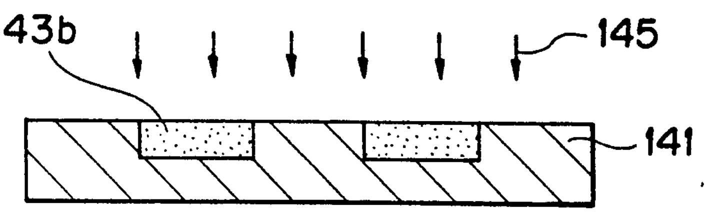
Figure 18:
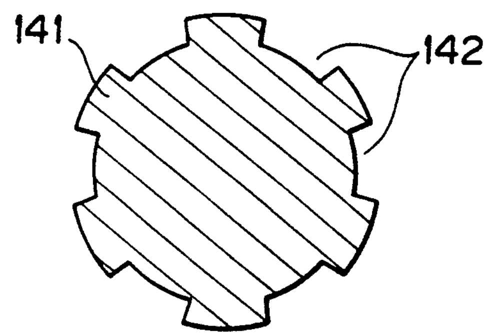
Figure 18:
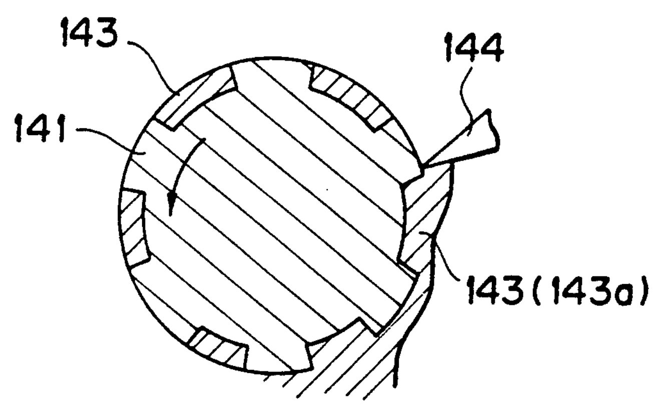
Figure 18:
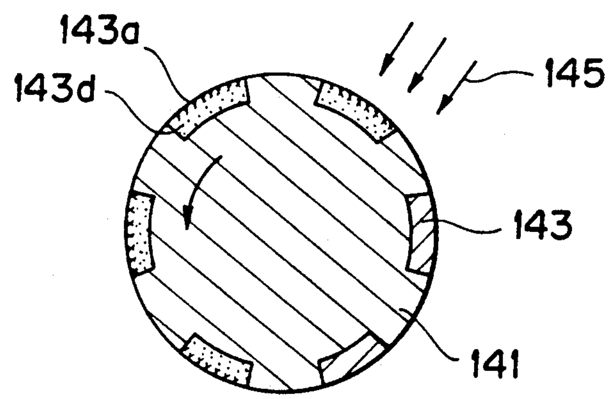

In the above formation of the transfer pattern FIG. 17), the pattern transferring plate is in the form of a planographic plate. Next, there is described a case wherein the pattern transferring plate is cylindrical, with reference to FIG. 18. FIGS. 18(A) to 18(C) are schematic views for illustrating steps for forming a transfer pattern on a cylindrical pattern transferring plate.

The steps shown in FIGS. 18(A) and 18(C) correspond to the steps shown in FIGS. 17(A) and 17(C). In these figures, the corresponding portions are denoted by the same reference numerals.

In such a case, as shown in FIG. 18(C), the ink 143 which has been subjected to patterning in the concavity 142 on the plate 141 or pattern plate portion, is subjected to a curing treatment by use of heat or radiation 145, and the ink 143 is cured so that at least a surface layer portion of the ink 143 is incompletely cured, thereby to form a transfer pattern. As a result, the curing type ink 143 is converted into one comprising an incompletely cured surface layer portion 143C and a completely cured portion 143*d*. Due to the curing treatment, the ink 143 is reaction activated to cause a viscosity increasing reaction or curing reaction in the concavity 142 of the cylindrical pattern transferring plate 141, whereby the fluidity of the ink disappears. In the incompletely cured surface layer portion 143C, the degree of curing is lower than that of the completely cured portion 143*d* and a physical property such as adhesion property remains in the surface layer portion 143C. The method for partially converting the ink surface layer into an incompletely cured state is not particularly restricted. Specific examples of such a method may include one wherein a curing characteristic of a curing type ink is utilized, one wherein the curing velocity is regulated by use of a curing inhibitor (or curing retarder), etc., one wherein the direction or degree of the curing treatment is regulated, etc.

The curing type ink to be used for such a purpose may comprise an ink predominantly comprising a resinous material which has an acrylic group or methacrylic group and is capable of being cured by vinyl polymerization. The ink of such a type has a property such that in the process of the polymerization thereof, the polymerization is inhibited in a portion thereof contacting the air under the action of oxygen. By using such a property, the ink surface layer portion 143C in the incomplete cured state may easily be formed. For example, when the curing treatment 145 as shown in FIG. 18(C) is effected, a portion which is disposed inside the concavity 142 and does not contact the air causes complete curing to be converted into the completely cured portion 143*d*. On the other hand, in a portion contacting the air, the polymerization is inhibited to be retarded, and such a portion is converted into the incompletely cured surface layer portion 143*c*.

The present invention may be embodied in various ways without deviating the spirit or predominant feature thereof. Therefore, the embodiments as described above are only examples in all respects, and the present invention should not be restricted to the specific embodiments as described above. The scope of the present invention is defined by claims, and is not confined to the body of the specification. Any modification or change falling within equivalent range of the claims is in the scope of the present invention.

What is claimed is:

1. An alignment method for use in a transfer process of pressing a transfer pattern formed on a pattern transferring plate to a work so as to transfer the transfer pattern to the work, the method comprising the steps of:

providing a pattern side register mark on the pattern transferring plate on which the transfer pattern has been formed;

providing a work side register mark on the work disposed on a work surface plate positioned opposite to the pattern transferring plate;

moving at least one of the work surface plate and the pattern transferring plate in a non-contact state, said pattern transferring plate comprising a roller having on its peripheral surface at least one of a conductive surface and concavity arrangement corresponding to the transfer pattern, utilizing an observation optical system during movement of said at least one of the work surface plate and the pattern transferring plate to observe optically the pattern side register mark and work side register mark so that the pattern side register mark and work side register mark are superposed on each other to effect registration between the transfer pattern and the work to provide information for the movement of the paltes; and upon the registration pressing the pattern transferring plate to the work thereby to transfer the transfer pattern to the work.

2. An alignment method according to claim 1, wherein a continuous operation of the registration between the transfer pattern and the work is achieved by moving at least one of the work surface plate and the pattern transferring plate in accordance with the information provided by the observation optical system until the transfer pattern is completely pressed to the work.

3. An alignment method according to claim 1, wherein the observation optical system transmits light through the pattern transferring plate and the work to detect the pattern side register mark and the work side register mark.

4. An alignment method according to claim 1, wherein the observation optical system reflects and senses light reflected from the work so as to detect the pattern side register mark and the work side register mark.

5. An alignment method for use in a transfer process by pressing a transfer pattern formed on a pattern transferring plate so as to transfer the transfer pattern to the work, the method comprising the steps of:

providing a pattern side non-adhesive register mark on a non-transfer region of the pattern transferring plate on which the transfer pattern has been formed;

providing a work side non-adhesive register mark on a non-adhesive region of the work disposed on a work surface plate positioned opposite to the pattern transferring plate;

moving at least one of the work surface plate and the pattern transferring plate in a non-contact state, said transferring plate comprising a roller having on its peripheral surface at least one of a conductive surface and concavity arrangement corresponding to the transfer pattern, utilizing an observation optical system during movement of said at least one of the work surface plate and the pattern transferring plate for observing the pattern side non-adhesive register mark and the work side non-adhesive register mark to provide information thereof so that registration is effected continuously by causing the non-transfer region provided with the pattern side non-adhesive register mark to closely contact the non-adhesive region provided with the work side non-adhesive register mark and to separate them from each other until an accurate position between the pattern transferring plate and the work is obtained; and pressing the pattern transferring plate to the work thereby to transfer the transfer pattern to the work.

6. An alignment apparatus for pressing a transfer pattern formed on a pattern transferring plate to a work disposed on a work surface plate positioned opposite to the pattern transferring plate so as to transfer the transfer pattern to the work, the apparatus comprising: said transferring plate comprising a roller having on its peripheral surface at least one of a conductive surface and concavity arrangement corresponding to the transfer pattern, an observation optical system for optically observing a pattern side register mark provided on the pattern transferring plate and a work side register mark provided on the work;

an alignment quantity calculation unit for calculating a positional difference between the pattern side register mark and the work side register mark in accordance with information provided by the observation optical system;

a stage control unit for outputting a control signal in accordance with a calculation result provided by the alignment quantity calculation unit; and a stage driving unit for moving the work surface plate to a position where the work side register mark and the pattern side register mark are superposed on each other, in accordance with the control signal output by the stage control unit.

7. An alignment apparatus according to claim 6, wherein the observation optical system includes means for transmitting light through the pattern transferring plate and the work to detect the pattern side register mark and the work side register mark.

8. An alignment apparatus according to claim 6, wherein the observation optical system includes means for reflecting and sensing light reflected from the work to detect the pattern side register mark and the work side register mark.

9. An alignment apparatus for pressing a transfer pattern formed on a pattern transferring plate to a work disposed on a work surface plate positioned opposite to the pattern transferring plate so as to transfer the transfer pattern to the work, the apparatus comprising:

a roller provided in the pattern transferring plate, said roller having on its peripheral surface at least one of conductive surface and concavity arrangement corresponding to the transfer pattern;

an observation optical system for optically observing a pattern side register mark provided on the pattern transferring plate and a work side register mark provided on the work;

an alignment quantity calculation unit for calculating a positional difference between the pattern side register mark and the work side register mark in accordance with information provided by the observation optical system;

a stage control unit for outputting a control signal in accordance with a calculation result provided by the alignment quantity calculation unit; and a pattern transfer plate driving unit for moving the pattern transferring plate to a position where the work side register mark and the pattern side register mark are superposed on each other, in accordance with the control signal output by the stage control unit.

10. An alignment apparatus according to claim 9, wherein the observation optical system includes means for transmitting light through the pattern transferring plate and the work to detect the pattern side register mark and the work side register mark.

11. An alignment apparatus according to claim 9, wherein the observation optical system includes means for reflecting and sensing light reflected from the work to detect the pattern side register mark and the work side register mark.

* * * * *